(12) United States Patent
Doan

(10) Patent No.: US 6,525,366 B2
(45) Date of Patent: Feb. 25, 2003

(54) UNIFORM DIELECTRIC LAYER AND METHOD TO FORM SAME

(75) Inventor: Trung Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/839,804

(22) Filed: Apr. 19, 2001

(65) Prior Publication Data

US 2001/0024886 A1 Sep. 27, 2001

Related U.S. Application Data

(62) Division of application No. 09/283,116, filed on Mar. 31, 1999, now Pat. No. 6,235,571.

(51) Int. Cl.⁷ ............................................. H01L 27/108
(52) U.S. Cl. ....................... 257/310; 257/306; 257/296
(58) Field of Search ................................. 257/296, 301, 257/302, 303, 304, 305, 306, 308, 309, 310, 311, 307

(56) References Cited

U.S. PATENT DOCUMENTS 5,441,908 A  *  8/1995  Lee et al.
5,445,999 A     8/1995  Thakur et al. .............. 438/396
5,736,775 A  *  4/1998  Sato
6,071,771 A     6/2000  Schuegraf ................... 438/240
6,110,775 A  *  8/2000  Fujii et al.
6,258,690 B1 *  7/2001  Zenke

* cited by examiner

Primary Examiner—Nathan J. Flynn
Assistant Examiner—Kevin Quinto

(57) ABSTRACT

An exemplary embodiment of the present invention discloses a method for forming a forming a storage capacitor having a uniform dielectric film, by a the steps of: forming a bottom electrode of the storage capacitor and an insulation material about the bottom electrode, the bottom electrode comprises a nitridation receptive material and the insulation material comprises a nitridation resistive material; depositing a layer of non-doped silicon to a thickness of 20Å or less over the bottom electrode and the insulation material; converting the silicon layer to a silicon nitride compound; depositing a silicon nitride of uniform thickness directly on the silicon nitride compound while using the silicon nitride compound as a nitride-nucleation enhancing surface; exposing the silicon nitride compound and the silicon nitride layer to an oxidation ambient to form a storage capacitor dielectric film; and then forming a top electrode of the storage capacitor over the storage capacitor dielectric film.

6 Claims, 4 Drawing Sheets

UNIFORM DIELECTRIC LAYER AND METHOD TO FORM SAME

This application is a divisional to U.S. patent application Ser. No. 09/283,116, filed Mar. 31, 1999 now U.S. Pat. No. 6,235,571.

FIELD OF THE INVENTION

This invention relates to semiconductor fabrication processing and more particularly to a method for forming uniform dielectric films used in semiconductor devices, such as dynamic random access memories (DRAMs).

BACKGROUND OF THE INVENTION

In the manufacturing of dynamic random access memories (DRAMs) the size of the memory cell is the main contributing factor to the density and overall size of the device. A manufacturer of DRAMs has motivation to increase the storage capability, while maintaining the smallest die size possible, as the smaller die size results in a lower cost per device. As mentioned, the main contributor to the size of a memory device is the amount of space required for each storage cell that makes up the storage array. In that regard, DRAM fabrication engineers have focused on structures, on materials to make the structures and on methods to fabricate the structures necessary to make a storage cell.

To save space, the capacitor of the storage cell must reduce in size and yet maintain adequate capacitance to retain a sufficient charge during DRAM operation. There are several approaches to the capacitor design, for example trench capacitors formed in the substrate of a wafer or a stacked capacitor formed above the wafer substrate, to name two. Regardless of the design chosen, the size of the capacitor must be reduced and yet maintain sufficient capacitance as mentioned previously. Two of the main contributors to capacitance are the surface area of the capacitor plates and the dielectric quality of the insulator separating the capacitor plates. Major engineering efforts have gone into both areas.

In regards to dielectric quality, thin film dielectrics having high dielectric constant characteristics have emerged as the dielectric of choice, as the thinnest film that can be placed between the capacitor plates to prevent dielectric breakdown when a charge is present on the capacitor plates, drastically increases capacitance. With increased capacitance, the overall size of the capacitor can be reduced. However, thin film dielectrics present some challenges in fabricating the complete storage cell structure, which includes a storage cell access transistor and a storage capacitor.

One main challenge and a critical area of concern is oxidation punch through, which is important to avoid when forming thin film dielectrics. Oxidation punch through refers to the mechanism of atomic oxygen diffusing completely through a dielectric film. In the case of a capacitor cell dielectric, if oxidation punch through was allowed to occur a portion of an underlying diffusion region of an access transistor would become oxidized and thus diminish the transistor's operating characteristics. It is critical that oxidation punch through be at least reduced or ideally avoided altogether. When dealing with thin film dielectrics the dielectric film needs to be thick enough to sufficiently to reduce oxidation punch through. The minimum thickness of the dielectric film is dependent on the required oxidation time and temperature used and is particularly critical to maintain when using the dielectric film as a capacitor cell dielectric. It is also important that the dielectric film be a uniform film in order to minimize the overall thickness of the film.

One of the thin dielectric films of choice is nitride (i.e., silicon nitride) as nitride possesses sufficient dielectric constant characteristics and can be deposited as a very thin layer (less than 100 Å). However, a nitride film of this thickness is difficult to deposit uniformly on a surface that is made up of different types of material, especially materials that are not receptive to nitride deposition. When trying to deposit thin nitride films on different types of materials, the surface free energy involved in the deposition reaction is different for each of the different types of materials. Thus the different types of materials do not allow the formation of a uniform dielectric film, particularly layers less than 100 Å.

The present invention teaches a method to successfully form uniform dielectric films as will become apparent to those skilled in the art from the following disclosure.

SUMMARY OF THE INVENTION

The present invention teaches a method for forming a uniform dielectric film in a semiconductor assembly. First, a nonconductive nitride-nucleation enhancing layer is formed over a semiconductor assembly that comprises a nitridation receptive material and a nitridation resistive material. For purposes of the present invention, a nitride-nucleation enhancing layer is a material that will readily accept the bonding of nitrogen atoms to the material itself. Next, a silicon nitride layer is formed over the nonconductive nitride-nucleation enhancing layer. The nonconductive nitride-nucleation enhancing layer provides for the silicon nitride layer to have a uniform thickness over both the nitridation receptive material and the nitridation resistive material.

The above method can be applied to devices that would benefit from the use of a thin dielectric film, such as a memory device (i.e., DRAM, floating gate device, etc.) that operates by storing a charge. For example, one implementation of the present invention is to form a nitride dielectric layer that is less than 100 Å in thickness for the intended use as a storage capacitor dielectric.

DETAILED DESCRIPTION OF THE INVENTION

An exemplary implementation of the present invention is directed to a process for forming a uniform dielectric layer used in a semiconductor device as depicted in FIGS. 1–4.

The following exemplary implementation is in reference to the fabrication of dynamic random access memory (DRAM) device. While the concepts of the present invention are conducive to the fabrication of DRAMs, the concepts taught herein may be applied to other semiconductor devices that would likewise benefit from the use of a thin dielectric film that will substantially reduce oxidation punch through. Therefore, the depiction of the present invention in reference to the manufacture of a DRAM (the preferred embodiment), is not meant to limit the extent to which one skilled in the art might apply the concepts taught hereinafter.

Figure 1:
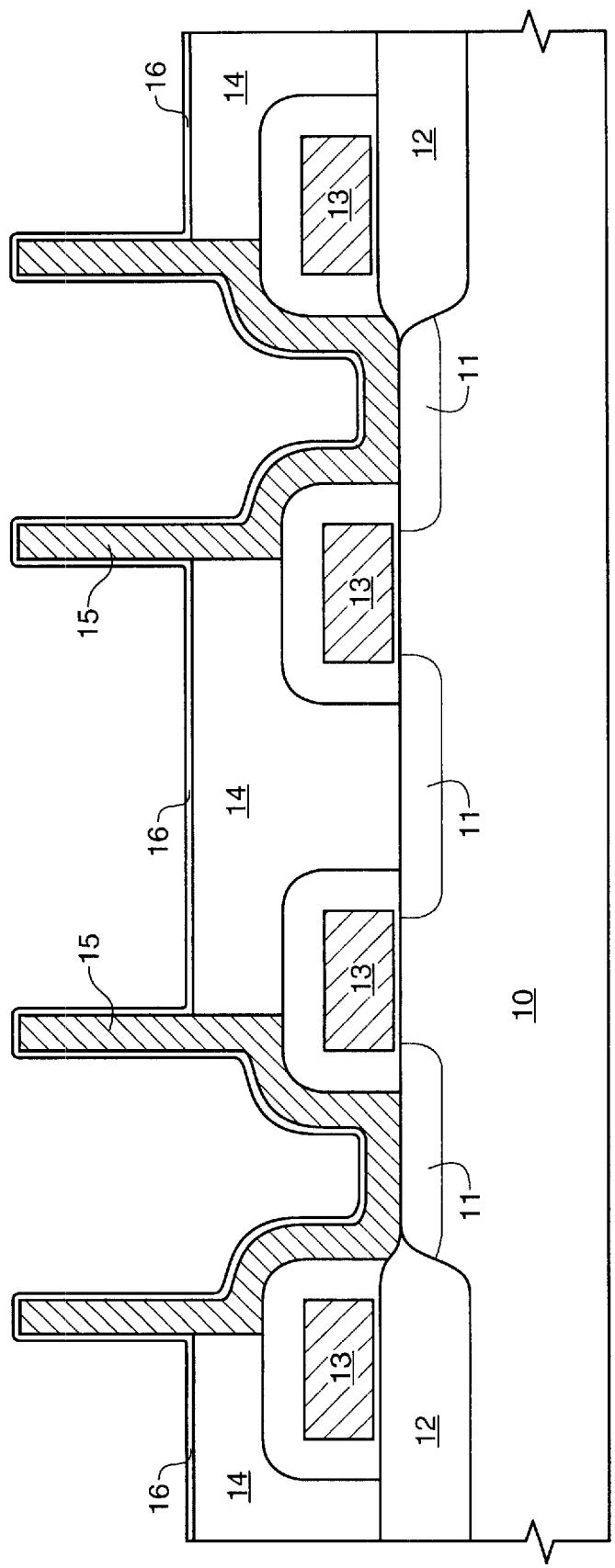
FIG. 1 is a cross-sectional view depicting a semiconductor substrate comprising portions of a memory storage cell having a storage cell access transistor and a bottom electrode for a storage capacitor and a conformal layer of polysilicon formed thereover.

Referring to FIG. 1, a semiconductive substrate 10, such as a silicon wafer, is prepared for the processing steps of the present invention. Transistor gate conductors (word lines) 13 and the transistor diffusion regions 11, separated by field oxide region 12, are formed by conventional DRAM fabrication methods. A layer of planarized insulation material 14 is formed over diffusion regions 11 and word lines 13. In one exemplary implementation, material 14 is a reflowable glass, such as BoroPhosphoSilicate Glass (BPSG). A cavity is patterned and etched into material 14 to receive a conductive material, such as polysilicon or hemispherical-grained (HSG) silicon, that is formed and patterned to produce a bottom plate 15 of a storage capacitor.

Generally, insulating materials such as BPSG, oxides and the like, do not provide atomic bonding surfaces that are receptive to nitridation (the bonding of nitrogen atoms to a given material). For purposes of the present invention these materials are labeled as "nitridation resistive materials." Generally, conductive materials and semiconductive materials, such as metals and silicon, respectively, do provide atomic bonding surfaces that are receptive to nitridation. For purposes of the present invention these materials are labeled as "nitridation receptive materials."

It is at this point that an implementation of an embodiment of the present invention is employed to fabricate a storage cell dielectric. A conformal nonconductive nitride-nucleation enhancing layer, such as non-conductive silicon layer 16 is formed directly on insulation material 14 and conductive bottom plate 15. The presence of layer 16 is critical for the formation of the cell dielectric. The purpose of layer 16 is to provide a uniform nucleation surface for a subsequent deposition of a cell dielectric material as layer 16 will possess a consistent surface free energy for the subsequent deposition. The ideal nitride-nucleation enhancing layer will allow almost immediate formation of a nitride film during the film deposition step, meaning the time required for nucleation, before the actual film deposition occurs, will be nearly zero. An enhancing layer that allows actual film deposition to occur less than 10 seconds from initial deposition start up time is desired. In that light, it is preferred that layer 16 be non-doped polysilicon deposited to a thickness of approximately 5–20 Å, or less, is possible in the particular process employed. Ideally, a continuous monolayer would be formed; although even a discontinuous layer (including a monolayer) is useful in accordance with the present invention. Non-doped polysilicon cannot be used as a cell dielectric by itself as polysilicon material is much too leaky. Non-doped polysilicon is a polysilicon layer that contains too small of a concentration of conductive impurities for the material to be considered to be conductive. However the conduction of polysilicon can be secured if conductive impurities are diffused into it. Therefore, it is preferred to minimize the thickness of the non-doped polysilicon used for layer 16. Conductively doped polysilicon can be used, however, an extra measure must be taken as discussed below.

Figure 2:
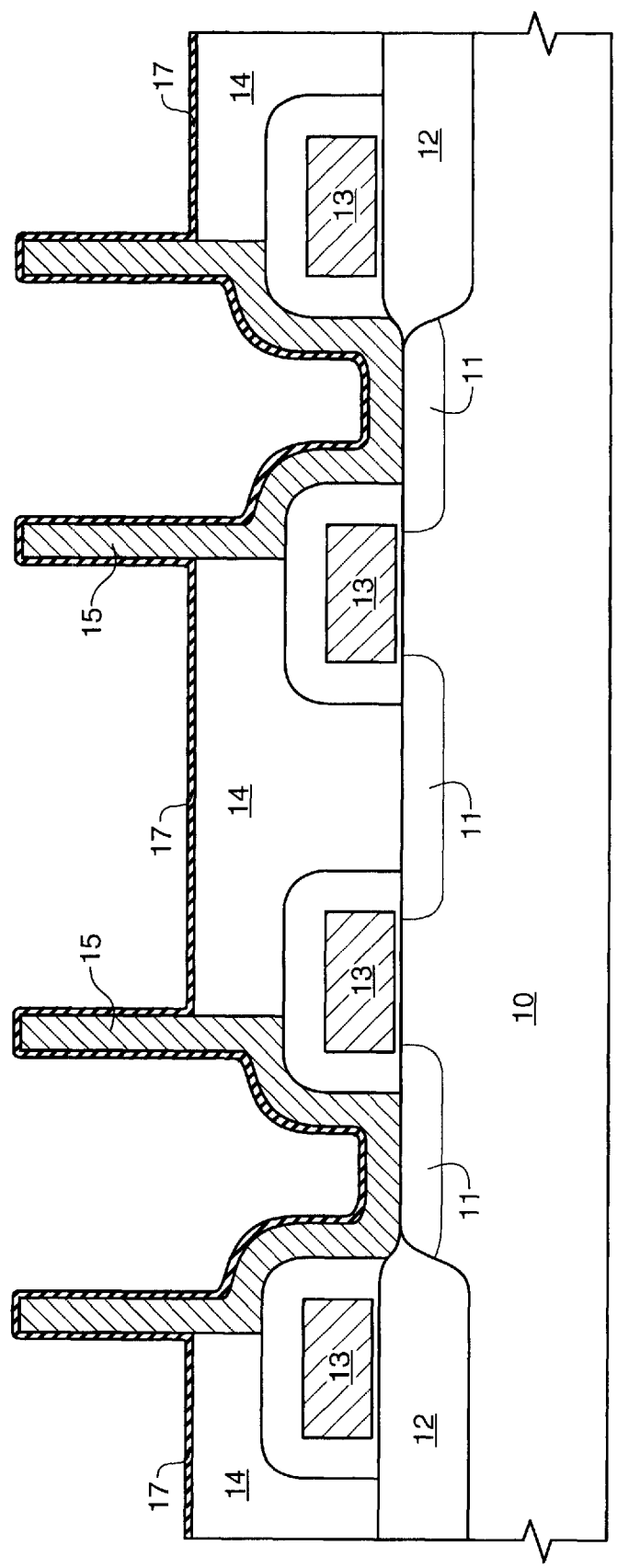
FIG. 2 is a subsequent cross-sectional view taken from FIG. 1 after converting the polysilicon layer to silicon nitride using a thermal nitridation step.

Referring now to FIG. 2, if desired, layer 16 of FIG. 1 is subjected to a thermal nitridation step in order to convert at least a portion of the silicon layer to silicon nitride layer 17. A typical thermal nitridation step can be used, such as releasing a nitrogen containing gas ($NH_3$) into a fabrication chamber that maintains a temperature of greater than 400° C. If it is desired to use a conductive material for layer 16, such as conductively doped polysilicon, the entire conductive material (i.e., a silicon film) must be converted to silicon nitride in order to avoid creating a conductive path between separate bottom electrodes 15. However, if so desired, this thermal nitridation step may be skipped if layer 16 is a non-conductive layer, such as non-doped polysilicon 16.

Figure 3:
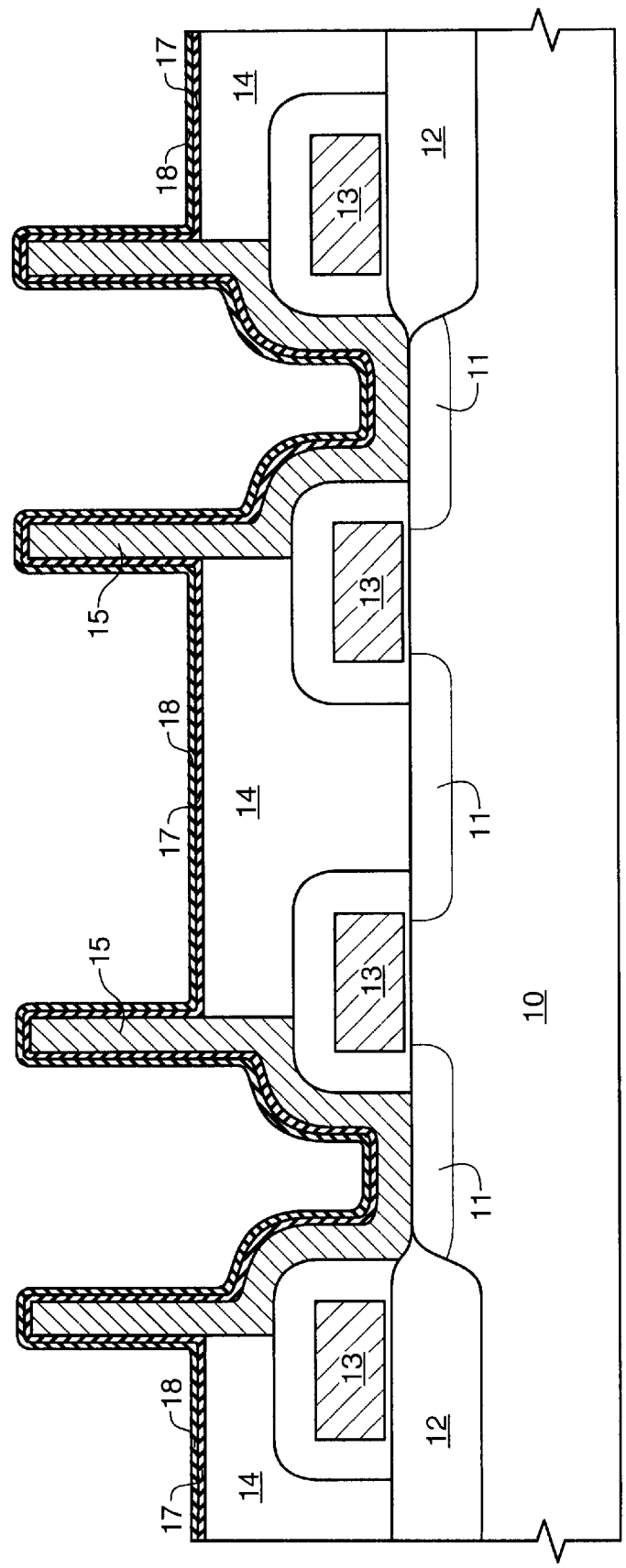
FIG. 3 is a subsequent cross-sectional view taken from FIG. 2 following the formation of a thin dielectric material to a desired thickness, over the silicon nitride layer.

Referring now to FIG. 3, a nitride layer 18 is deposited to a thickness such that when combined with nucleation layer 16 the total thickness is approximately less than 100 Å (50Å or less is preferred). The nucleation layer 16 or converted nitride layer 17 (if converted to nitride) provides a consistent nucleation surface for the deposition of nitride layer 18, thus resulting in a nitride film of uniform thickness overlying material 14 (a nitridation resistive material) and bottom electrode 15 (a nitridation receptive material). Nitride layer 18 can be formed insitu after the formation of the silicon layer by simply presenting a silicon source gas (such as $SiH_4$, diclorosilane and $SiH_2Cl_2$) and a nitrogen source gas (such as $NH_3$) to the deposition chamber using deposition conditions suitable for both polysilicon and nitride deposition.

Figure 4:
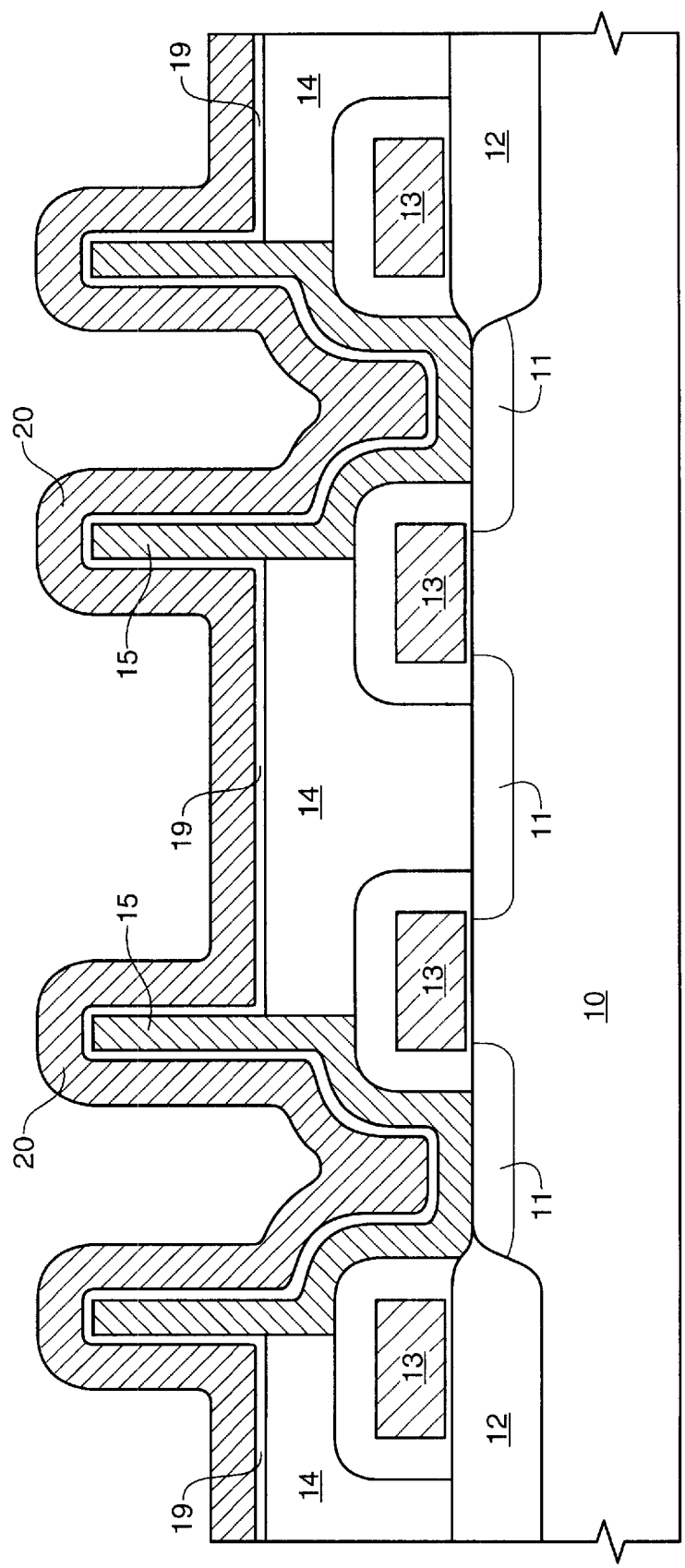
FIG. 4 is a subsequent cross-sectional view taken from FIG. 3 following the formation of a top electrode for the storage capacitor.

Referring now to FIG. 4, nucleation layer 16 (FIG. 1), whether silicon or a converted silicon nitride layer (as shown at 17 in FIG. 2) combined with deposited silicon nitride layer 18 (FIG. 3) are now represented as cell nitride dielectric layer 19. With a consistent, uniform thickness less than 100 Å (50 Å or less is preferred), cell nitride dielectric layer 19 now possesses a thickness that is sufficient to prevent oxidation punch through from a subsequent wet oxidation step needed to fill any pinholes in layer 19. Oxidation punch through refers to the mechanism of atomic oxygen diffusing completely through a dielectric film and diffusing all the way to an implanted region. In this example, if punch through were allowed, oxygen atoms would possibly reach implanted regions 11, which would result in oxidation of the implanted source/drain regions 11. Typically, a nitride film used as a cell dielectric is subjected to an oxidation ambient, at a moderate temperature (750–850° C.) and for a prolonged period of time. If oxygen atoms reach an implanted diffusion region, the region will oxidize which means the oxidation process will consume some of the silicon in the implanted diffusion region and thus adversely affect transistor operation. Using the methods of the present invention the oxidation of cell dielectric layer 19 would limit punch through and thus greatly limit the oxidation of the implanted diffusion regions 11.

Continuing with FIG. 4, a top storage capacitor electrode is fabricated by the formation of a conductive layer. 18 to complete storage capacitor formation. From this point on the device is completed as dictated by the fabrication process used by those skilled in the art.

Though an exemplary implementation of the present invention described above teaches the use of silicon nitride in a storage capacitor, the method would also apply to other dielectric films, such as $TaO_5$, and other devices, such as a floating gate device. Using $TaO_5$ for example would require forming a layer of tantalum for layer 16, converting it to $TaO_5$ (layer 17) and depositing a layer of $TaO_5$ (layer 18) to a desired thickness.

It is to be understood that although the present invention has been described with reference to a preferred embodiment, various modifications, known to those skilled in the art, may be made to the process steps presented herein without departing from the invention as recited in the several claims appended hereto.

What is claimed is:

1. A semiconductor assembly comprising:

a non-conductive polysilicon layer overlying and in direct contact to a nitride resistive material and a nitride receptive material, said non-conductive polysilicon layer covered by a nitride layer with substantially consistent thickness overlying both said materials, wherein a surface of said nitride resistive material and a surface of said nitride receptive material is 50 Å or less from an outermost surface of said nitride layer.

2. A memory array in a semiconductor assembly comprising:

a capacitor storage electrode isolated by insulation material, said capacitor storage electrode being made of a nitride receptive material and said insulation material being made of a nitride resistive material;

a non-conductive polysilicon layer overlying and in direct contact to said capacitor storage electrode and said insulation material;

a nitride layer with substantially consistent thickness overlying said capacitor storage electrode and said insulation material;

wherein a surface of said capacitor electrode and a surface of said insulation material is 50 Å or less from an outermost surface of said nitride layer.

3. A semiconductor assembly comprising:

a non-conductive polysilicon layer overlying and in direct contact to a nitride resistive material and a nitride receptive material, said non-conductive polysilicon layer covered by a nitride layer with substantially consistent thickness of 50 Å or less overlying both said materials.

4. A semiconductor assembly comprising:

a nitride resistive material and a nitride receptive material;

a non-conductive polysilicon layer overlying and in direct contact to said capacitor storage electrode and said insulation material; and a nitride layer with substantially consistent thickness of 50 Å or less overlying both said materials.

5. A memory array in a semiconductor assembly comprising:

a capacitor storage electrode isolated by insulation material, said capacitor storage electrode being made of a nitride receptive material and said insulation material being made of a nitride resistive material;

a non-conductive polysilicon layer overlying and in direct contact to said capacitor storage electrode and said insulation material; and a nitride layer with substantially consistent thickness of 50 Å or less overlying said capacitor storage electrode and said insulation material.

6. A random access memory array in a semiconductor assembly comprising:

a capacitor storage electrode isolated by insulation material, said capacitor storage electrode being made of a nitride receptive material and said insulation material being made of a nitride resistive material;

a non-conductive polysilicon layer overlying and in direct contact to said capacitor storage electrode and said insulation material; and a nitride layer with substantially consistent thickness of 50 Å or less overlying said capacitor storage electrode and said insulation material.

* * * * *